United States Patent [19]

Togawa et al.

[11] Patent Number: 5,716,450
[45] Date of Patent: Feb. 10, 1998

[54] GROWING METHOD OF GALLIUM NITRIDE RELATED COMPOUND SEMICONDUCTOR CRYSTAL AND GALLIUM NITRIDE RELATED COMPOUND SEMICONDUCTOR DEVICE

[75] Inventors: Seiji Togawa; Hitoshi Okazaki, both of Toda, Japan

[73] Assignee: Japan Energy Corporation, Tokyo, Japan

[21] Appl. No.: 557,095
[22] PCT Filed: Apr. 5, 1995
[86] PCT No.: PCT/JP95/00654
  § 371 Date: Dec. 6, 1995
  § 102(e) Date: Dec. 6, 1995
[87] PCT Pub. No.: WO95/27815
  PCT Pub. Date: Oct. 19, 1995

[30] Foreign Application Priority Data

Apr. 8, 1994 [JP] Japan ........................... 6-093963
Sep. 16, 1994 [JP] Japan ........................... 6-246803

[51] Int. Cl.⁶ ........................................... C30B 23/00
[52] U.S. Cl. ........................ 117/101; 117/952; 117/902; 117/88
[58] Field of Search ........................ 117/952, 902, 117/101, 88

[56] References Cited

U.S. PATENT DOCUMENTS

4,855,249  8/1989  Alasaki et al. .................. 117/952
5,290,393  3/1994  Nakamura .

FOREIGN PATENT DOCUMENTS

40 06 449 A1  9/1990  European Pat. Off. .

OTHER PUBLICATIONS

Haisma et al., "Lattice Constant–Adaptable Crystalographics", Journel of Crystal Growth, vol. 100, No. 4, Jun. 1990.
Hisaki Kato et al., Journal of Crystal Growth, MOVPE growth of GaN on a . . . , vol. 107, No. 1/4, Jan. 1991, pp. 509–512.

Primary Examiner—Robert Kunemund

[57] ABSTRACT

In a method of growing a gallium nitride related compound semiconductor crystal on a single crystal substrate, the {011} plane or the {101} plane of rare earth group 13 (3B) perovskite is used as the single crystal substrate. As a result, a gallium nitride group semiconductor crystal excellent in crystallinity can be grown epitaxially.

4 Claims, 2 Drawing Sheets

GROWING METHOD OF GALLIUM NITRIDE RELATED COMPOUND SEMICONDUCTOR CRYSTAL AND GALLIUM NITRIDE RELATED COMPOUND SEMICONDUCTOR DEVICE

TECHNICAL FIELD

The present invention relates to a method of growing a gallium nitride related compound semiconductor crystal, and more particularly, to a method of growing a gallium nitride related compound semiconductor crystal suitable for blue light emitting materials and excellent in crystallinity, and a gallium nitride related compound semiconductor device.

BACKGROUND ART

Recently, notice is focused on gallium nitride related compound semiconductors ($In_xGa_yAl_{1-x-y}N$) ($0 \leq x$, y; $x+y \leq 1$) as blue light emitting materials.

In the case where gallium nitride related compound semiconductor crystal is grown on a sapphire ($\alpha$-$Al_2O_3$) substrate, there are many cases in which the gallium nitride related compound semiconductor crystal with the (0001) plane is grown on the (0001) plane of the sapphire. In this case, the lattice mismatch is up to 16% and, therefore, it was impossible to grow a gallium nitride related compound semiconductor crystal with good quality.

For this reason, in order to solve the problem, the following two methods were proposed as a method of growing a gallium nitride related compound semiconductor crystal:

(1) A method in which single crystalline sapphire is used as a substrate, and a buffer layer is first grown for the purpose of relaxation of lattice mismatching between the sapphire substrate and the gallium nitride related compound semiconductor crystal, and then the gallium nitride related compound semiconductor crystal is grown; and (2) A method in which a single crystal matching to gallium nitride related compound semiconductor in the crystal structure and lattice constant as close as possible, is used as a substrate.

As the first method are known a method (Japanese Patent Application Publication (Examined) No. Tokuko-Sho 59-48794) in which an AlN buffer layer is used and a method (Japanese Patent Application Publication (Laid-Open) No. Tokukai-Hei 4-297023) in which a GaAlN buffer layer is used.

Certainly, by introducing these buffer layers, the crystallinity and surface morphology of the gallium nitride related compound semiconductor crystal is improved to some extent. However, since the gallium nitride related compound semiconductor crystal inevitably has the lattice mismatching to the sapphire substrate, the crystal is still in the distorted state. For this reason, in the case of using such crystal to produce a light emitting device, there is a problem that significant improvement in brightness cannot be obtained and the lifetime is short.

In the second method, there are known a method (Japanese Patent Application Publication (Laid-Open) No. Tokukai-Sho 49-3899) in which aluminium garnet ($ReAl_2Al_3O_{12}$) or gallium garnet ($ReAl_2Ga_3O_{12}$) is used as a substrate, and a method (Japanese Patent Application Publication (Laid-Open) No. Tokukai-Hei 4-209577) in which MnO, ZnO, MgO, CaO etc. are used as a substrate. However, for aluminium garnet or gallium garnet whose lattice constant falls in a range of 12.00 to 12.57 Å, the lattice distance of (111) plane only corresponds to the fifth times a axis of GaN and therefore the lattice matching is not necessarily good.

Further, although the lattice matching is good in MnO, ZnO, MgO, CaO, etc., these oxides are weak in heat. Accordingly, in the case of growing gallium nitride related compound semiconductor crystal, which is required to grow at high temperature of about 1000° C., there is a problem that the substrate is subjected to thermal decomposition and a gallium nitride related compound semiconductor crystal layer with good quality cannot be obtained.

DISCLOSURE OF THE INVENTION

The present invention is made to solve such problems and an object of the present invention is to provide a method of growing a gallium nitride related compound semiconductor crystal with high quality suitable for blue light emitting material and gallium nitride related compound semiconductor device by using a single crystal substrate with relatively good lattice matching to the gallium nitride related compound semiconductor crystal and stable under the growing condition of the gallium nitride related compound semiconductor crystal.

The inventors reached the present invention after finding that rare earth 13 (3B) group perovskites among which is rare earth gallium perovskite ($ReGaO_3$: Re is a rare earth element), are extremely superior for the growth of the gallium nitride related compound semiconductor crystal.

That is, the present invention provides a method of growing a gallium nitride related compound semiconductor crystal on a single crystal substrate which method is characterized in that the {011} plane or the {101} plane of rare earth 13 (3B) group perovskite is used as the single crystal substrate.

Further, the present invention provides a gallium nitride related compound semiconductor device comprising a gallium nitride related compound semiconductor crystal grown on the {011} plane or the {101} plane of a rare earth 13 (3B) group perovskite single crystal substrate containing one or more rare earth elements.

The rare earth 13 (3B) group perovskite includes at least one of aluminium, gallium and indium as the 13 (3B) group and one or more rare earth elements.

Note that the {011} plane and the {101} plane represent equivalent planes to the (011) plane and the (101) plane, respectively.

Generally, rare earth 13 (3B) group perovskite has a high melting point and is stable at the temperature of about 1000° C. at which a gallium nitride related compound semiconductor crystal is grown and is chemically stable against source gas such as HCl and $NH_3$. Further, it has good lattice matching to a gallium nitride related compound semiconductor crystal as described later.

FIG. 1 shows the configuration of 13 (3B) group atoms in the (011) plane or the (101) plane of orthorhombic rare earth 13 (3B) group perovskite crystals.

The lattice distance shown by a dotted line in FIG. 1 is equal to the length of a axis in the (011) plane and equal to the length of b axis in the (101) plane. The lattice distance shown by a solid line is approximately equal to half the square root of the sum of respective squares of the lengths of a, b and c axes. In the rare earth 13 (3B) group perovskites, the length of a axis is approximately equal to that of b axis and the length of c axis is approximately equal to half the square root of the sum of respective squares of the lengths of a and b axes. Therefore, in the (011) plane or the (101) plane of the rare earth 13 (3B) group perovskite crystals, the 13 (3B) group atoms are configured substantially in a state of hexagonal lattice, as shown in FIG. 1.

Next, FIG. 2 shows the configuration of Ga atoms in the (0001) plane of GaN. The lattice distance shown by a dotted line is $3^{1/2}$ times the length of a axis and the lattice distance shown by a solid line is equal to the length of a axis.

FIG. 3 is a diagram showing a correspondence relation of the atomic configuration in the (011) plane or the (101) plane of rare earth gallium perovskite crystal when Nd is chosen as a rare earth element and the atomic configuration in the (0001) plane of GaN. In the figure, an open circle (○) shows the atomic configuration in the (011) plane or the (101) plane of rare earth gallium perovskite crystal and a filled circle (●) shows the atomic configuration of Ga or N in the (0001) plane of GaN.

From FIG. 3, it could be understood that the lattice matching can be obtained if $3^{1/2}$ times the length of a axis of GaN is approximately equal to either half the square root of the sum of respective squares of the lengths of a, b and c axes, the length of a axis, or the length of b axis, of rare earth gallium perovskite.

In the case of the rare earth gallium perovskite crystals, the lattice mismatch to GaN is within a range of 0.1% to 6.1%, which is considerably small compared to 16% of sapphire. Specifically, in the case of $LaGaO_3$, $PrGaO_3$, and $NdGaO_3$, the mismatch is in a range of 0.1 to 1.8%.

In the case of rare earth aluminium perovskite crystals, the mismatch is in a range of 3.6 to 8.3%.

Further, in the case of rare earth indium perovskite crystals, while the lattice mismatch to GaN becomes larger, in the case of $NdInO_3$, an approximate lattice matching to $In_{0.4}Ga0.6N$ is included. Use of $NdInO_3$ is advantageous for growing the mixed crystals of InN and GaN.

Since the uppermost surface layer of the substrate consists of 13 (3B) group elements in the {011} plane or the {101} plane of the rare earth 13 (3B) group perovskite crystal, it could be considered that gallium nitride related compound semiconductor crystal containing the same type of elements is readily grown compared to the case where a substrate of sapphire in which the same type of elements are not contained is used.

BEST MODE FOR CARRYING OUT THE INVENTION

Figure 1:
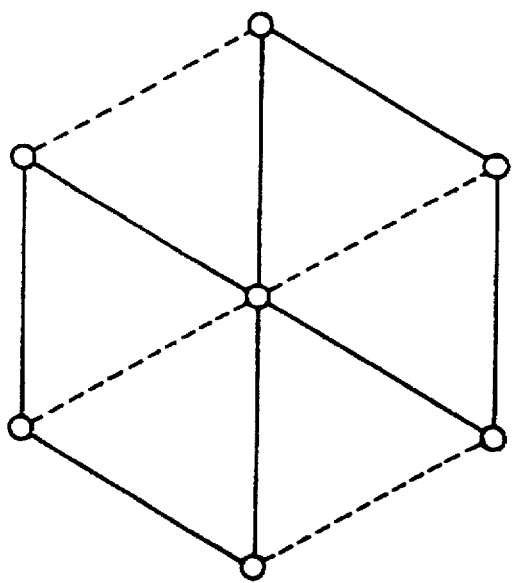
FIG. 1 is a configuration diagram of 13 (3B) group atoms in the (011) plane or the (101) plane of rare earth 13 (3B) group perovskite.
Figure 2:
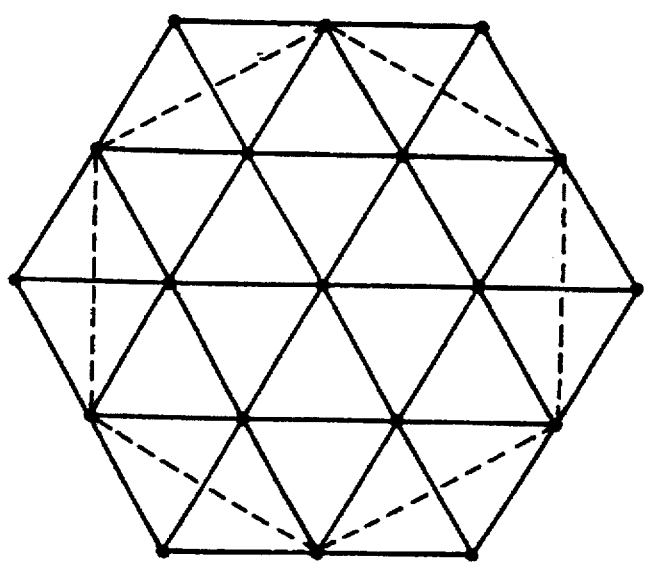
FIG. 2 is a configuration diagram of Ga atoms in the (0001) plane of GaN.
Figure 3:
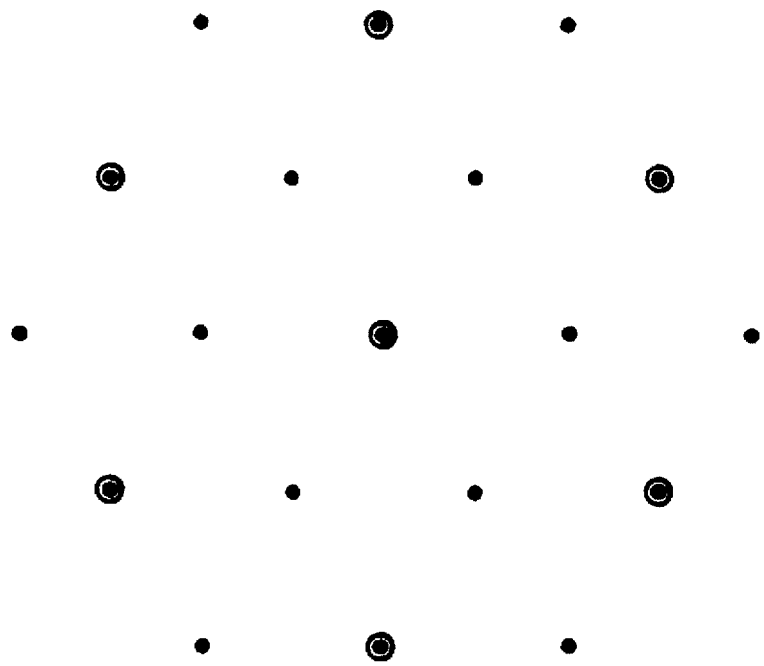
FIG. 3 is a diagram showing a correspondence relation between the atomic configuration in the (011) plane or the (101) plane of rare earth gallium perovskite and the atomic configuration in the (0001) plane of GaN.

Embodiments in which a gallium nitride related compound semiconductor crystal is grown on the (101) plane of single crystal substrates of $NdGaO_3$ as rare earth gallium perovskite will be described.

(EMBODIMENT 1)

Single crystalline $NdGaO_3$ (101) substrates with 350 μm in thickness were set in a MOCVD apparatus, after rinsing with organic solvent. After the substrate was heated to clean the surface with flowing mixture gas of hydrogen and nitrogen, at 1050° C. (substrate temperature), a GaN film was grown for 60 min by adding ammonia gas and trimethyl gallium to the mixture gas of hydrogen and nitrogen.

The obtained GaN film had the thickness of about 3 μm. Although abnormal growth was observed a little on the surface, the number of abnormal growth points was reduced to about 1/10 compared to a GaN film grown on a sapphire substrate in the same method.

(EMBODIMENT 2)

Until the step of cleaning the substrate surface by hydrogen, steps similar to those of Embodiment 1 were executed. After the surface cleaning, the substrate temperature was downed to 550° C. and a GaN buffer layer with 200 Å in thickness was grown by adding ammonia gas and trimethyl gallium to the mixture gas of hydrogen and nitrogen.

The supply of trimethyl gallium was stopped and the substrate temperature was raised to 1050° C. again under the ammonia atmosphere. Then, trimethyl gallium was again supplied to grow a GaN film for 60 min.

Any abnormal growth was not observed on the obtained GaN film surface, the carrier density and the hall mobility of the GaN film were 300 $cm^2/Vs$ and $5\times10^{17}$ $cm^3$, respectively. The GaN film was good in crystallinity. The carrier density and the hall mobility were about a half and about twice respectively, compared to those of a GaN film which was grown on a sapphire substrate with a GaN buffer layer in the same method.

(EMBODIMENT 3)

After the buffer layer of GaN was grown in the same manner as in the embodiment 2, the substrate temperature was raised to 800° C. Then, $In_xGa_{1-x}N$ was grown for 120 min by supplying trimethyl indium in addition to trimethyl gallium.

The obtained $In_xGa_{1-x}N$ film had a thickness of about 1 μm and any abnormal growth was not observed on the surface. As a result of EPMA analysis, a mole fraction of In was about 10% (x=0.1). A full width at half-maximum of X-ray diffraction was about 2 min. Compared to about 10 min of an $In_xGa_{1-x}N$ film which was grown on a sapphire substrate with a GaN buffer layer by the same method, the full width at half-maximum of the obtained film was small, which indicated that the obtained film had good crystallinity.

(EMBODIMENT 4)

A substrate which was rinsed by an organic solvent in the same manner as in the embodiment 1 was set in a hydride VPE apparatus. A substrate and Ga material were heated to 800° C. and 850° C., respectively, with flowing nitrogen gas. Hydrogen chloride gas diluted by nitrogen gas was flowed from the upstream side of the Ga material. At the same time, ammonia gas was flowed just before the substrate so as to by-pass the Ga material section and GaN was grown on the substrate for 60 min. In this case, an certain amount of hydrogen chloride gas was flowed together with ammonia gas so that crystallization of GaN on an inner wall of a reaction tube could be suppressed.

The obtained GaN film had the thickness of about 10 μm and abnormal growth was not almost observed. A GaN film which was formed on a sapphire substrate in the same method was grown only in an island manner, whose surface morphology was much different from that of the film grown on the $NdGaO_3$ (101) substrate.

Note that X-ray diffraction analysis showed that there existed a small amount of GaN with other orientations in the obtained GaN film.

(EMBODIMENT 5)

The growth was made in the same manner as in the embodiment 4 except that a single crystal substrate of NdGaO$_3$ having inclination of 5 degrees from the (101) plane was used.

No abnormal growth was entirely observed in the surface of the obtained GaN film. Growth in another orientation was not also entirely observed in X-ray diffraction analysis. The obtained film was the (0001) oriented GaN epitaxial film.

The GaN films obtained in the above embodiments is suitable for light emitting material for light emission diodes (LED), semiconductor laser diodes or the like, of blue light with a good light emission efficiency.

Note that the rare earth 13 (3B) group perovskite crystal may contain two or more rare earth elements.

Industrial Applicability

As described above, according to the present invention, since there is used as a substrate the {011} plane or the {101} plane of thermally and chemically stable rare earth 13 (3B) group perovskite which has relatively good lattice matching to the gallium nitride related semiconductor crystal, a gallium nitride related compound semiconductor device can be obtained with good quality suitable for light emitting material for light emitting diodes (LED), semiconductor laser diodes (LD) or the like, which emit blue light.

We claim:

1. A method of growing a gallium nitride related compound semiconductor crystal on a single crystal substrate; wherein rare earth 13 (3B) group perovskite crystal containing one or more rare earth elements is used as said single crystal substrate, and the growth is made by using the {011} plane or the {101} plane as a growth plane.

2. A method of growing gallium nitride related compound semiconductor crystal on a single crystal substrate according to claim 1; wherein said rare earth 13 (3B) group perovskite crystal comprises at least one element selected from the group consisting of aluminium, gallium and indium, as the rare earth 13 (3B) group element.

3. A gallium nitride related compound semiconductor device comprising a gallium nitride related compound semiconductor crystal grown on the {011} plane or the {101} plane of a rare earth 13 (3B) group perovskite single crystal substrate containing one or more rare earth elements.

4. A gallium nitride related compound semiconductor device according to claim 3, wherein said rare earth 13 (3B) group perovskite single crystal substrate comprises at least one element selected from the group consisting of aluminium, gallium and indium as the rare earth group 13 (3B) element.

* * * * *